(12) United States Patent
Tang et al.

(10) Patent No.: US 9,171,834 B2
(45) Date of Patent: Oct. 27, 2015

(54) OVER VOLTAGE PROTECTION FOR A THIN OXIDE LOAD CIRCUIT

(71) Applicants: Xinghai Tang, Cedar Park, TX (US); Hector Sanchez, Cedar Park, TX (US)

(72) Inventors: Xinghai Tang, Cedar Park, TX (US); Hector Sanchez, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 214 days.

(21) Appl. No.: 13/690,046

(22) Filed: Nov. 30, 2012

(65) Prior Publication Data

US 2014/0153148 A1     Jun. 5, 2014

(51) Int. Cl.
*H02H 9/04*     (2006.01)
*H05K 3/30*     (2006.01)
*H01L 27/02*    (2006.01)

(52) U.S. Cl.
CPC ............ *H01L 27/0266* (2013.01); *H02H 9/046* (2013.01); *Y10T 29/4913* (2015.01)

(58) Field of Classification Search
CPC ......... H02H 9/04; H05K 3/30; Y10T 29/4913
USPC ....................................................... 361/91.5
See application file for complete search history.

(56) References Cited

U.S. PATENT DOCUMENTS

| | | | |
|---|---|---|---|
| 7,701,184 B2 | 4/2010 | Pan | |
| 7,723,962 B2 | 5/2010 | Parkes, Jr. et al. | |
| 7,847,524 B2 | 12/2010 | Parkes, Jr. et al. | |
| 7,977,984 B1* | 7/2011 | D'Souza et al. | 327/157 |
| 8,027,131 B2 | 9/2011 | Bach | |
| 2006/0274473 A1* | 12/2006 | Reddy et al. | 361/118 |
| 2007/0267701 A1* | 11/2007 | Sung et al. | 257/365 |
| 2008/0231243 A1* | 9/2008 | Zhong et al. | 323/273 |
| 2009/0243870 A1* | 10/2009 | Dai et al. | 340/662 |
| 2009/0323234 A1* | 12/2009 | Bach | 361/56 |

OTHER PUBLICATIONS

Mandal et al., Ring oscillators: CHaracteristics and applications, Feb. 2010, Indian Journal of Pure & Applied Physics, vol. 48, pp. 136-145.*

* cited by examiner

*Primary Examiner* — Thienvu Tran
*Assistant Examiner* — Kevin J Comber
(74) *Attorney, Agent, or Firm* — The Mason Group Patent Specialists LLC; Valerie M. Davis

(57) ABSTRACT

An IC includes: a substrate having a thick oxide portion and a thin oxide portion; a load circuit disposed on the thin oxide portion and coupled between a supply node and a virtual supply node; and a current source circuit and protection circuit disposed on the substrate. The current source circuit has an output coupled to the virtual supply node and is operable to provide a voltage at the virtual supply node. The protection circuit includes a sensing portion and a protection portion. The sensing portion is coupled to the virtual supply node and is operable to detect the voltage at the virtual supply node. The protection portion is coupled to the sensing portion and is operable, in response to the sensed voltage, to prevent a difference in voltage between the voltage at the virtual supply node and a second voltage at the supply node from exceeding a maximum voltage.

20 Claims, 7 Drawing Sheets

US 9,171,834 B2

OVER VOLTAGE PROTECTION FOR A THIN OXIDE LOAD CIRCUIT

FIELD

The present disclosure relates generally to over voltage protection, and more specifically to an integrated circuit that provide over voltage protection for a thin oxide load circuit.

BACKGROUND

In many integrated circuits (ICs) fabricated using a manufacturing process such as a dual-oxide, complementary metal oxide semiconductor (CMOS) process, there is at least one circuit whose components are built within or formed on a thin oxide portion of a substrate and, thereby, comprise one or more thin oxide devices. Such circuits are referred to herein as "thin oxide load circuits" or simply "thin oxide circuits." Thin oxide devices have higher intrinsic gain than do thick oxide devices (i.e., devices formed in a thick oxide portion of the substrate). However, the thin oxide devices cannot withstand as high of a voltage without damage, as can the thick oxide devices. One consideration is voltage swings of the drain-to-source voltage at a current source transistor that provides a source/drain voltage to one or more thin oxide transistors. This is because too high of a gate-to-source/drain voltage can easily damage these thin oxide transistors. To prevent such damage, an IC containing one or more thin oxide devices should also contain suitable over voltage protection for the thin oxide devices.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
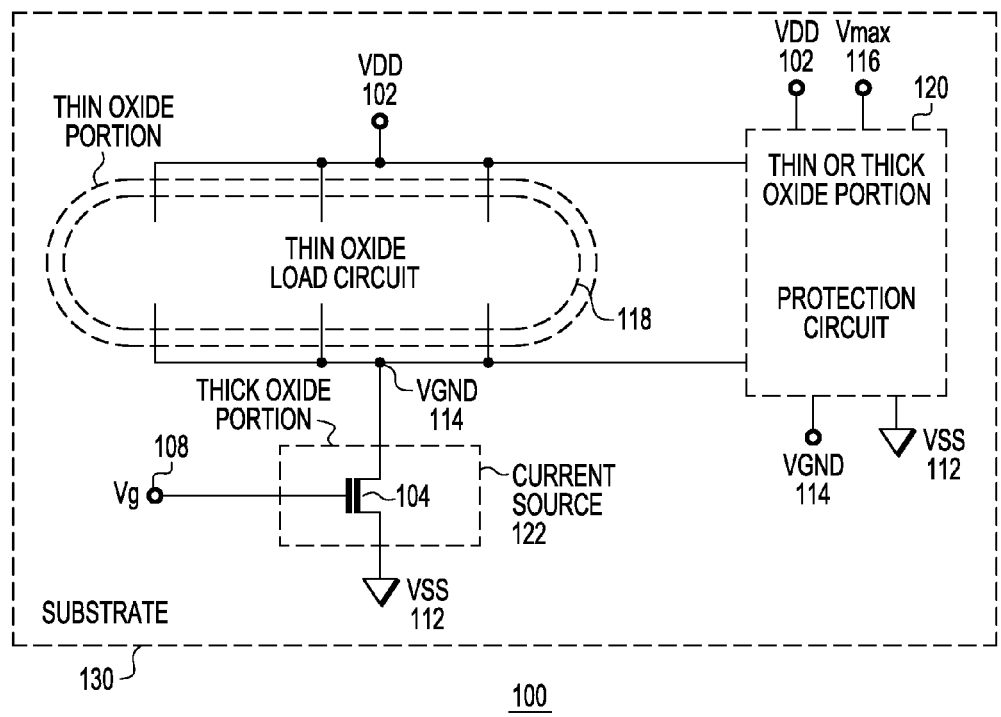
FIG. 1 is a generalized block diagram illustrating a CMOS integrated circuit with a thick oxide current source device, a thin oxide load circuit, and a protection circuit for the thin oxide load circuit, in accordance with an embodiment.

The present invention is illustrated by way of example and is not limited by the accompanying figures, in which like references indicate similar elements. Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

The present disclosure describes a CMOS integrated circuit that provides both a generated voltage to a thin oxide circuit containing thin oxide devices on the IC and over voltage protection for the thin oxide devices, as defined in the accompanying claims. In some embodiments, an N-channel metal oxide semiconductor (NMOS) current source is used. In other embodiments, a P-channel metal oxide semiconductor (PMOS) current source is used. A number of different embodiments use diodes, diode-connected transistors, transistors operating in the triode region, CMOS transmission gates, and comparators as feedback circuits within a voltage protection circuit, which provides over voltage protection for the thin oxide devices on the IC. Further embodiments describe voltage protection circuits that also provide an output (also referred to herein as an alert signal) indicating an operational status of the thin oxide circuit and more specifically an effective drain to source voltage of the thin oxide circuit.

In one particular embodiment is an integrated circuit that provides over voltage protection for a thin oxide load circuit. The integrated circuit comprises: a substrate having a thick oxide portion and a thin oxide portion; a load circuit disposed on the thin oxide portion, wherein the load circuit is coupled between a supply node and a virtual supply node; a current source circuit disposed on the substrate, the current source circuit having an input coupled to a control signal node and an output coupled to the virtual ground node, wherein the current source circuit is operable to provide a voltage at the virtual supply node, which is based on a control signal coupled to the control signal node; and a protection circuit disposed on the substrate, the protection circuit comprising a sensing portion and a protection portion, wherein the sensing portion is coupled to the virtual supply and is operable to sense the voltage at the virtual supply node, and the protection portion is coupled to the sensing portion and is operable, in response to feedback from the sensing portion of the sensed voltage, to prevent a difference in voltage between the voltage at the virtual ground node and a second voltage at the supply node from exceeding a first maximum voltage value.

In accordance with another embodiment is a method of fabricating an integrated circuit on a substrate having a thick oxide portion and a thin oxide portion. The method comprises: forming a load circuit on the thin oxide portion of the substrate, wherein the load circuit is coupled between a supply node and a virtual ground node; the current source circuit having an input coupled to a control signal node and an output coupled to the virtual ground node, wherein the current source circuit is operable to provide a voltage level at the virtual ground node, which is based on a control signal coupled to the control signal node; forming a protection circuit on the substrate, the protection circuit comprising a sensing portion and a protection portion, wherein the sensing portion is coupled to the virtual ground node and is operable to sense the voltage level at the virtual ground node, and the protection portion is coupled to the sensing portion and is operable, in response to feedback from the sensing portion of the sensed voltage level, to prevent a difference in voltage between the voltage at the virtual ground node and a second voltage at the supply node from exceeding a first maximum voltage value.

Turning now to FIG. 1, shown therein is a block diagram illustrating an integrated circuit 100 that includes a voltage protection circuit (also referred to herein simply as a protection circuit) for a thin oxide load circuit on the IC, in accordance with an embodiment. The IC 100 includes a substrate 130 have a thick oxide portion and a thin oxide portion. The IC 100 further comprises a thin oxide load circuit 118 disposed on the thin oxide portion of the substrate; a current source circuit 122 disposed on the thick oxide portion of the substrate; and a protection circuit 120 disposed on the thin oxide portion or the thick oxide portion of the substrate. The IC 100 further includes first and second power supply sources (not shown) disposed on substrate. The first power supply source provides a positive voltage VDD at a first supply node 102, and the second power supply source provides a more negative voltage VSS at a second supply node 112. In an embodiment, VSS is at a ground potential. However, VSS need only be at a more negative potential than VDD.

In this embodiment, the current source 122 comprises a single N-channel Metal Oxide Semiconductor transistor 104 (used as a current sink) having a gate terminal connected to a control signal node 108, a second (drain) terminal connected to a virtual supply node (which in this embodiment is a virtual ground (VGND) node) 114 and a third (source) terminal connected to the second supply node 112. The current source 122 is operable to receive a control signal (Vg) (having a positive potential) coupled to the control signal node 108 (as provided by a voltage source, which is not shown) and to provide a virtual ground voltage (VGND) at the VGND node 114, which is based on the magnitude of the control signal (Vg), which in turn controls the magnitude of current through the NMOS transistor 104. The control signal (Vg) is set to a magnitude to (in most instances of IC operation) control the voltage differential between the first supply node 102 and the virtual ground node 114. In an embodiment, the control signal (Vg) is set to a magnitude to control the voltage differential (VDD–VGND) to be less than 1 volt (V), across the thin oxide load circuit 118. In an alternate embodiment (as described in detail with respect to FIG. 12), the current source circuit comprises a P-channel Metal Oxide Semiconductor transistor having a gate terminal connected to the control signal node, a second (drain) terminal connected to the virtual supply node (which in this latter embodiment supplies a voltage VBB that is higher than VGND) and a third terminal (source) connected to a second supply node (which in this latter embodiment is the supply node having the largest potential).

Figure 2:
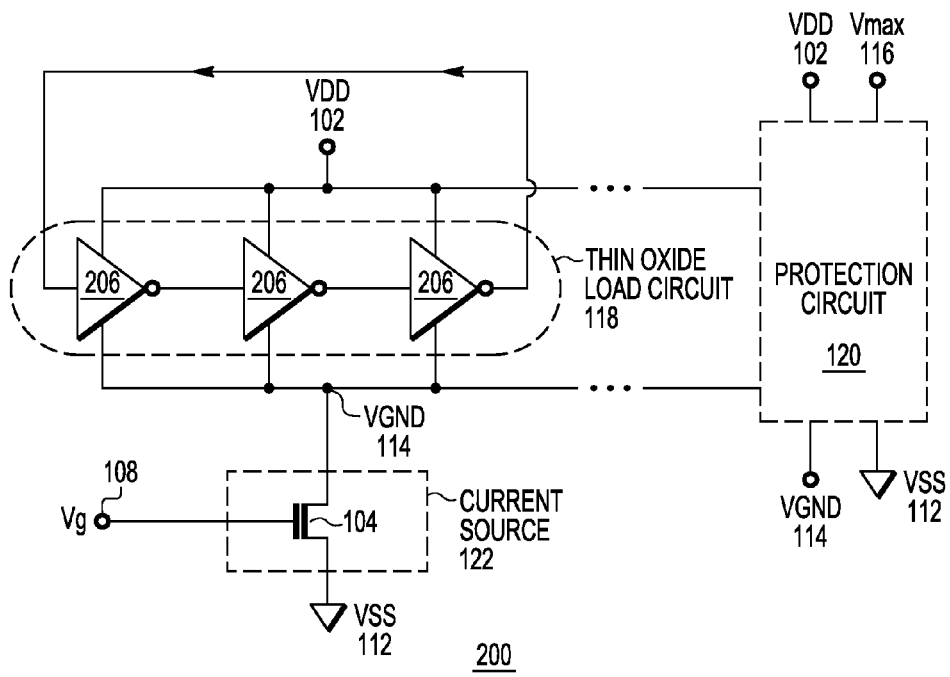
FIG. 2 illustrates a current source transistor, a thin oxide load circuit comprising a CMOS ring oscillator, and a protection circuit for the thin oxide load circuit, in accordance with an embodiment.
Figure 3:
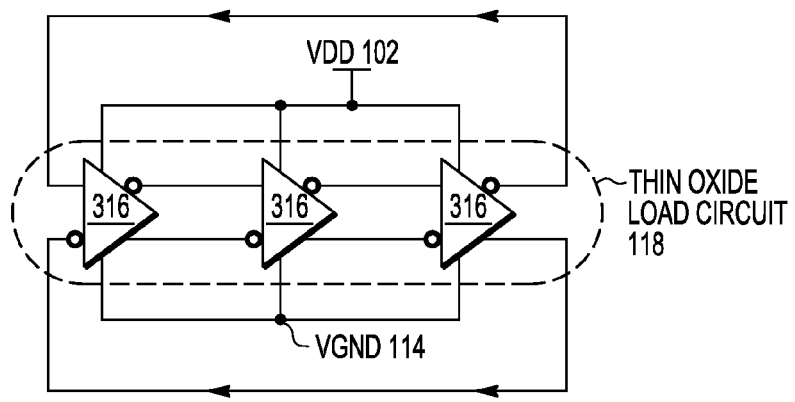
FIG. 3 is a circuit diagram illustrating a differential ring oscillator that can be provided with over voltage protection using a protection circuit in accordance with an embodiment.

The thin oxide load circuit 118 implementation depends on how the IC is used. In one embodiment, the thin oxide load circuit 118 comprises a ring oscillator that includes a chain of an odd number of inverters, wherein each inverter has a first terminal connected to the first supply node (e.g., 102) and a second terminal connected to the virtual ground node (e.g., 114), as shown in FIGS. 2 and 3. In one embodiment of the IC 100 illustrated in FIG. 2 as an IC 200, the ring oscillator 118 comprises a single-ended oscillator, which comprises three inverters (or inverter stages) 206, although any number of inverter stages can be used. The other elements of FIG. 2 are similar to the identically numbered elements shown in FIG. 1, the description of which is not repeated for brevity. In the embodiment shown in FIG. 3, the ring oscillator 118 comprises a differential oscillator that includes three inverter stages 316, although any number of inverter stages can be used. Examples of other thin oxide load circuits include, but are not limited to, radio frequency (RF) circuits, memory circuits, logic circuits, etc.

The voltage protection circuit 120 is used to limit or clamp the voltage difference between VDD and VGND at nodes 102 and 114, respectively, in order to provide over voltage protection for the thin oxide load circuit 118. This voltage difference is clamped to a pre-determined value (also referred to herein as a first maximum voltage value) as established by the potentials of VDD and the control signal (Vg) provided, at the node 108, to the gate of the current source 122. A benefit of the voltage protection circuit embodiments in accordance with the present teachings is that they provide over voltage protection in many different scenarios including over voltages during IC start up and spikes in voltages during operation (such as during a noise event). FIGS. 4-11 illustrate various embodiments of the voltage protection circuit 120, which is connected to different sets (i.e., one or more) of the nodes 102 (to receive VDD), 112 (to receive VSS), 114 (to receive VGND), or to a maximum voltage node 116 (to receive a voltage having a potential Vmax, also referred to herein as a second maximum voltage value), depending on the particular embodiment of the protection circuit.

Figures 4, 5:
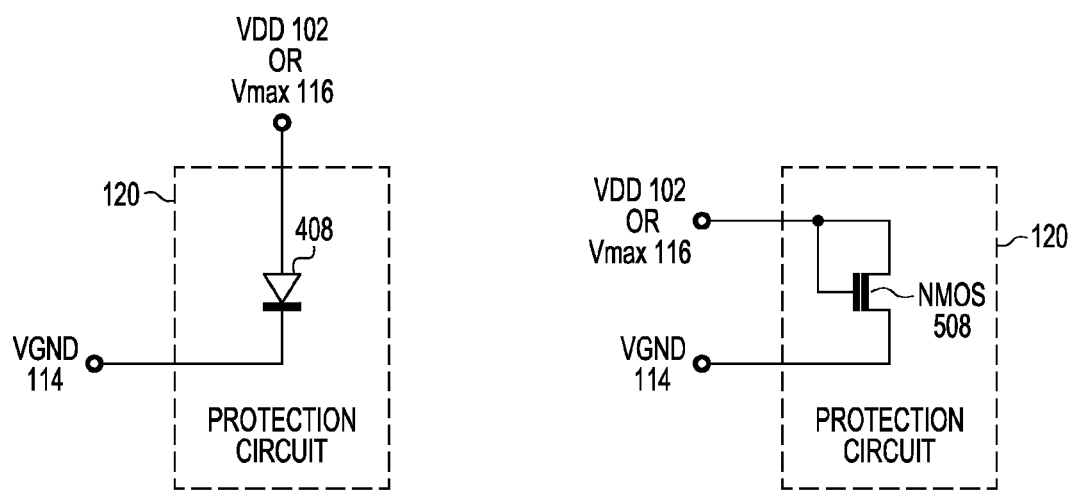
FIG. 4 illustrates a semiconductor diode used to provide over voltage protection, in accordance with an embodiment.
FIG. 5 illustrates a diode-connected transistor used to provide over voltage protection, in accordance with an embodiment.

In the simplest embodiment, the protection circuit 120 comprises one or more diodes, for instance one or more forward biased semiconductor diodes. For example, FIG. 4 illustrates a single diode 408 used to implement the protection circuit 120. Diode 408 has a first terminal (cathode) coupled to the virtual ground node 114 and a second terminal (anode) coupled to the supply node 102 or to the maximum voltage node 116 that is configured to receive the second maximum voltage value Vmax. Within this protection circuit 120, the anode and cathode connections serve as the sensing portion to sense any changes to the voltage of VGND at node 114 or the voltage at node 102 or 116, to thereby sense a difference between VGND and VDD or between VGND and Vmax. The feedback from the sensing portion of this voltage differential is used by the protection portion of the protection circuit 120, which is implemented through the intrinsic operation of the diode 408, to provide a hard clamping or limiting of the voltage difference across the thin oxide load circuit 118 to a predetermined value, e.g., 1.0 V if the most positive terminal 102 is at potential VDD or a predetermined value based on the potential of Vmax if the anode is connected to Vmax.

More particularly, a silicon semiconductor diode (e.g., 408) begins to conduct current at around 0.7 V, and conducts an extremely large current at voltages of the order 1.0 V. This effectively clamps the voltage across the diode at a maximum of 1.0 V when the most positive voltage on the diode 408 is VDD, which corresponds to an operating voltage of the order of 0.7 V across the thin oxide load circuit 118 with a hard clamping maximum voltage across the thin oxide load circuit 118 of 1.0 V. If the most positive voltage on the diode 408 is instead Vmax (e.g., some voltage larger than VDD, for example VDD+0.3 V), the diode 408 responds with a hard clamping action when the voltage across the thin oxide load circuit 118 reaches 0.7 V. This corresponds to a lower operating voltage of the order of 0.5 V across the thin oxide load circuit 118.

In a further embodiment, the protection circuit (e.g., 120) comprises a diode-connected transistor, meaning a transistor comprising a first terminal connected to a virtual ground node (e.g., 114) and a second and third terminal coupled to a supply node (e.g., 102) or to a maximum voltage node (e.g., 116) that is configured to receive a second maximum voltage value (e.g., Vmax). More particularly, in the embodiments illustrated by reference to FIGS. 5 and 6, the second terminal comprises a gate terminal, and the second and third terminal are (directly) connected together and connected to the supply node or to the maximum voltage node. These embodiments provide for analog implementations of the protection circuit. Alternatively, in the embodiment illustrated in FIG. 8, the second terminal comprises a gate terminal, and wherein the integrated circuit further comprises a Complementary Metal-Oxide Semiconductor (CMOS) transmission gate connected between the gate terminal and the supply node or the maximum voltage node to control conductivity of the diode-connected transistor using first and second enabling voltages. These embodiments, having a CMOS transmission or pass gate coupled to the gate of the diode-connected transistor, provide digital control for enabling the protection circuit.

For example, FIG. 5 illustrates an embodiment, wherein the protection circuit 120 is a diode-connected transistor 508 that comprises an N-channel Metal Oxide Semiconductor transistor. Specifically, the transistor 508 has its source terminal connected to the virtual ground node 114 and its gate and drain terminals connected together and further connected to the supply node 102 (to receive VDD) or to the maximum voltage node 116 (to receive Vmax), in order to limit the voltage difference VDD−VGND or Vmax−VGND to a predetermined maximum value. During operation, the diode-connected transistor 508 rapidly conducts more and more current as the voltage difference between the source and the drain-gate connection increases (e.g., as VDD−VGND or Vmax−VGND increases). Particularly, the current through the transistor 508 has a quadratic dependence on the voltage difference between the source and the drain-gate connection, above the threshold voltage, Vt, of the transistor. This rapid increase in current forces VGND at the virtual ground node 114 to also rise more dramatically and serves to clamp or limit the voltage difference, VDD−VGND, across the thin oxide load circuit 118 to about 1 V in one embodiment, when the gate and drain are connected to VDD. In the alternative arrangement of the diode-connected NMOS transistor 508, the gate and drain are connected to Vmax, which in an embodiment is a more positive or higher voltage than VDD. This arrangement results in the NMOS transistor 508 operating in the triode region (instead of the saturation region) to conduct even more current as the voltage difference between the source and the drain-gate connection increases.

Within the protection circuit 508, the gate, drain, and source connections serve as the sensing portion to sense any changes to the virtual ground voltage VGND at node 114 or the voltage at node 102 or 116, to thereby sense a difference between VGND and VDD or between VGND and Vmax. The feedback from the sensing portion of this voltage differential is used by the protection portion of the protection circuit 508, which is implemented through the intrinsic operation of the transistor, to provide a clamping or limiting of the voltage difference across the thin oxide load circuit 118 to a predetermined value, e.g., 1.0 V, if the gate and drain are connected to VDD or a predetermined maximum value based on the potential of Vmax if the gate and drain are connected to Vmax.

Figure 6:
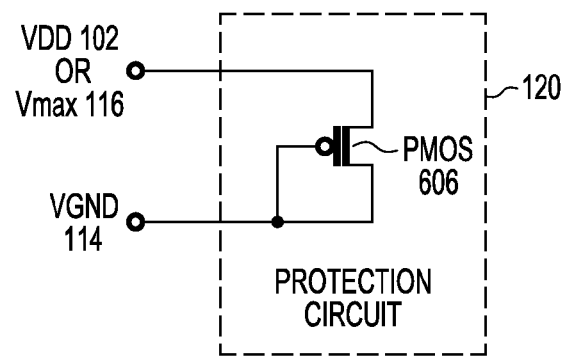
FIG. 6 illustrates a PMOS transistor used as a voltage protection circuit, in accordance with an embodiment.

FIG. 6 illustrates an embodiment, wherein the protection circuit 120 is a diode-connected transistor that comprises a P-channel Metal Oxide Semiconductor transistor 606. Specifically, the transistor 606 has its gate and drain terminals connected together and further connected to the virtual ground node 114 and its source terminal connected to the supply node 102 (to receive VDD) or to the maximum voltage node 116 (to receive Vmax), in order to limit the voltage difference VDD−VGND or Vmax−VGND. During operation, when the source is connected to VDD or Vmax, the transistor 606 provides a large increase in current through the transistor with an increasing voltage difference between the source and the drain-gate connection, to limit or clamp the voltage difference, VDD−VGND or Vmax−VGND.

Figure 7:
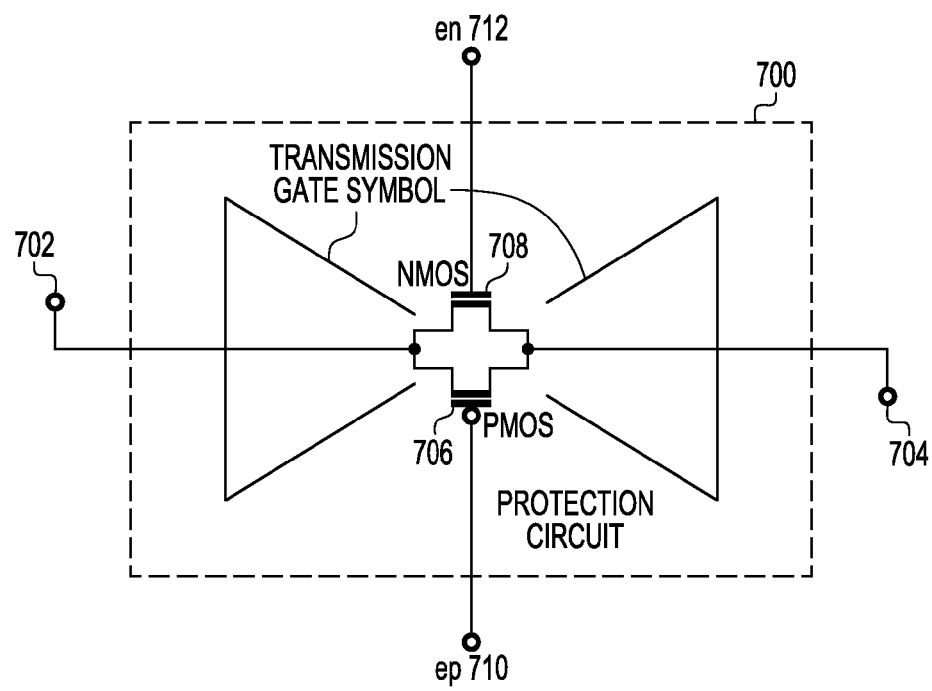
FIG. 7 illustrates a CMOS transmission gate that can be used to implement a voltage protection circuit, in accordance with an embodiment.
Figure 8:
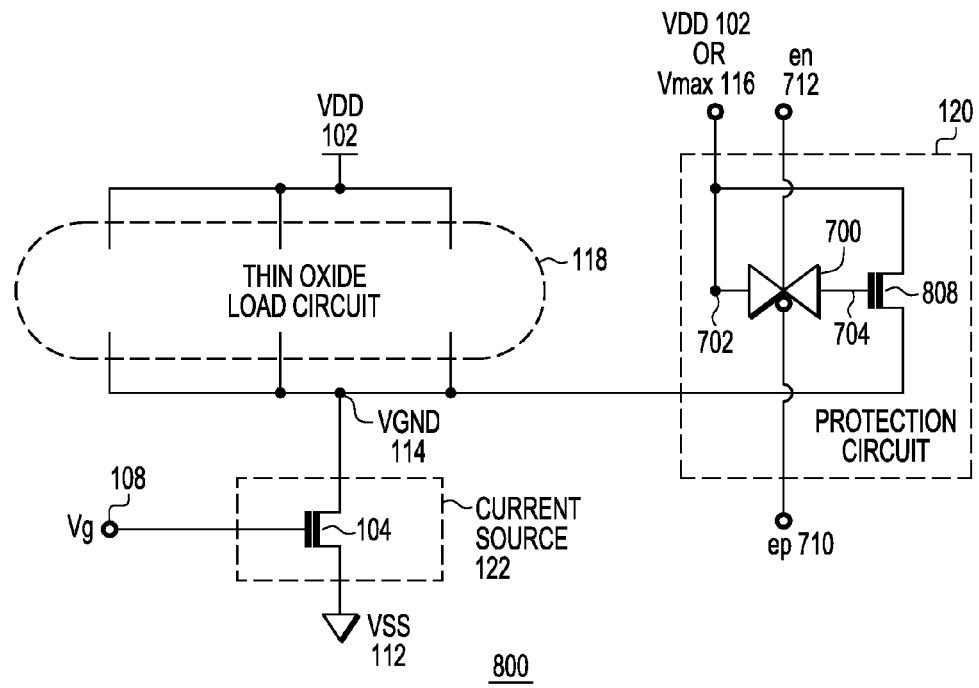
FIG. 8 illustrates a CMOS transmission gate used in a voltage protection circuit, in accordance with an embodiment.

FIG. 7 illustrates a CMOS transmission or pass gate 700, that can be used in protection circuit embodiments in accordance with the present teachings (e.g., as shown in FIG. 8). The transmission gate 700 includes two parallel connected NMOS (708) and PMOS (706) transistors, wherein drain terminals 702 of the transistors are connected together, and source terminals 704 of the transistors are connected together. This arrangement creates a conduction path between terminals 702 and 704 when the transistors are turned on. Particularly, driving a gate terminal 712 of the NMOS transistor 708 to a positive enabling potential (en) and driving a gate terminal 710 of the PMOS transistor 706 with a negative enabling voltage (ep) turns the transistors on to create the conduction path. Conversely, if the enabling potential (en) is a negative voltage and the enabling potential (ep) is a positive voltage, both transistors are off, thereby disabling the conduction path between the terminals 702 and 704.

FIG. 8 illustrates a circuit 800 that includes a protection circuit 120, in accordance with an embodiment of the present disclosure, which includes the CMOS transmission gate arrangement shown in FIG. 7. Circuit 800 includes a similar thin oxide load circuit 118 and current source circuit 122 arranged and connected as described above by reference to FIG. 1, the description of which is not repeated here for brevity. In addition to the transmission gate 700, the protection circuit 120 further comprises an NMOS transistor 808. As can be seen, the drain terminals 702 of the transmission gate 700 are connected to the node 102 (to receive VDD) or to the node 116 (to receive Vmax), and the source terminals 704 of the transmission gate 700 are connected to the gate of the transistor 808. Moreover, the drain of the transistor 808 is connected to the drain terminals 702 of the transmission gate 700, and the source of the transistor 808 is connected to VGND at the node 114. When the transmission gate 700 is on and conducting, the protection circuit 120 in this embodiment operates as described by reference to the protection circuit shown in FIG. 5 and described above. A benefit of utilizing the transmission gate 700 is the protection strength can be programmable. For example, by using an array of transmission gates and transistors, one can selectively turn on or off the transmission gate and program different amounts of protection strength.

Figure 9:
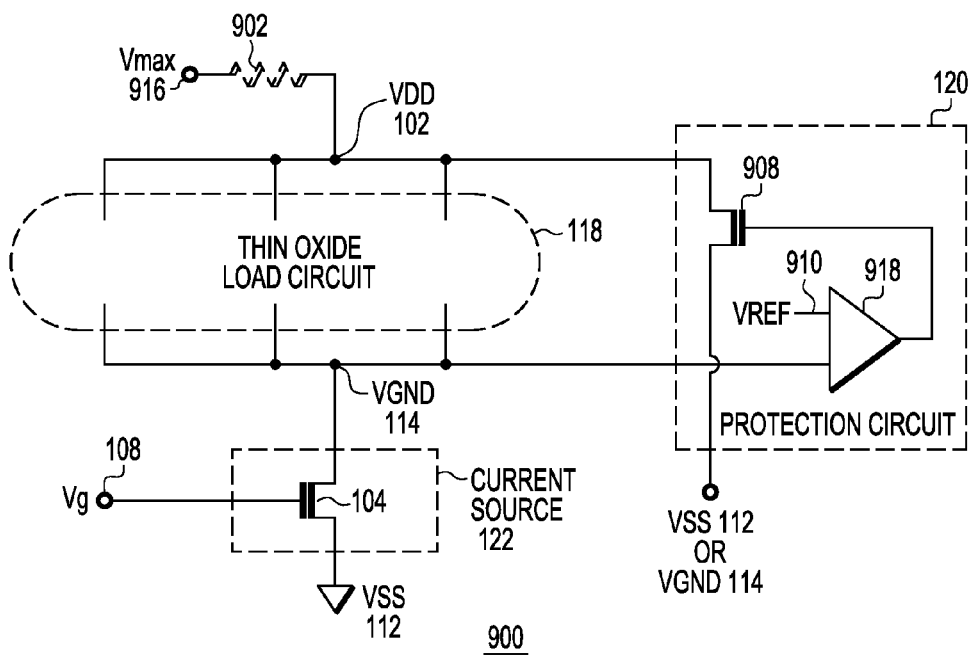
FIG. 9 illustrates a voltage protection circuit having a comparator for voltage feedback, in accordance with an embodiment.
Figure 10:
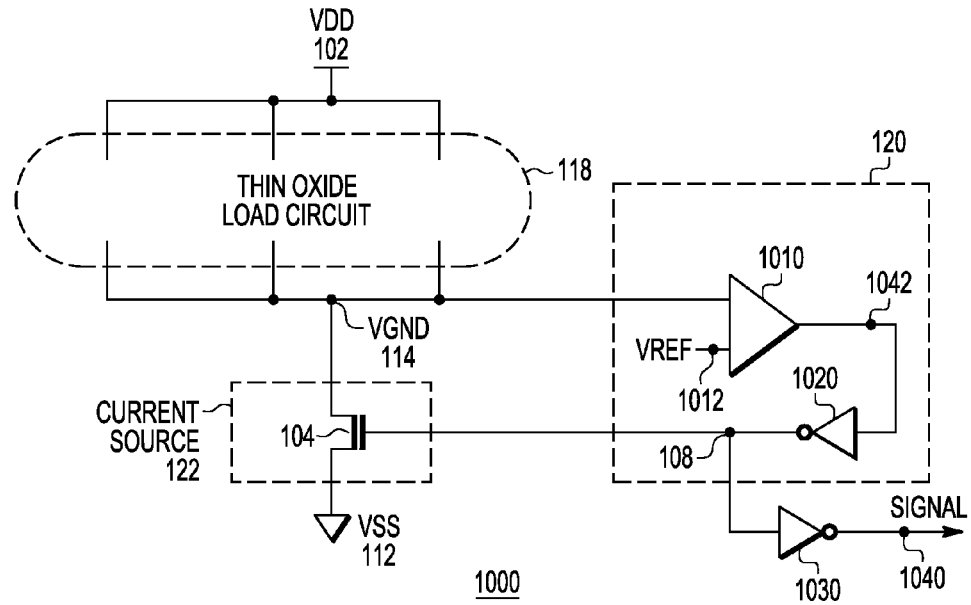
FIG. 10 illustrates a voltage protection circuit having a comparator for voltage feedback and that provides an alert signal, in accordance with an embodiment.
Figure 11:
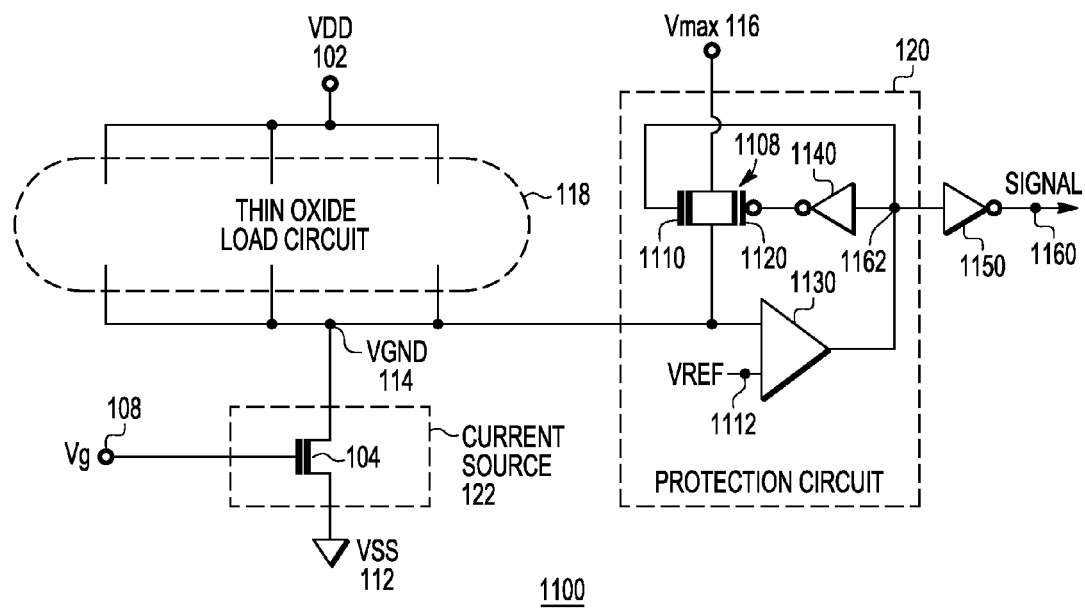
FIG. 11 illustrates a more complex voltage protection circuit having a comparator for voltage feedback and that provides an alert signal, in accordance with an embodiment.

FIGS. 9-11 illustrate embodiments of the protection circuit (e.g., 120), wherein the sensing portion of the protection circuit comprises a comparator having a first input terminal (e.g., a non inverting input) connected to the virtual ground node (e.g., 114), a second input terminal (e.g., an inverting input) connected to a voltage reference node that is configured to receive a reference voltage (Vref), and an output terminal. The comparator provides feedback of the voltage at the virtual ground node to the protection portion of the protection circuit to use in limiting the voltage across the thin oxide load circuit. In an embodiment, the comparator is an operational amplifier, and the reference voltage Vref=Vmin, wherein Vmin (which in an embodiment is 0.5V), for example, is the minimum allowed voltage for VGND that corresponds to a maximum allowed voltage across the thin oxide load circuit.

More particularly, FIG. 9 illustrates a circuit 900 that includes a protection circuit 120, in accordance with an embodiment of the present disclosure. Two embodiments will be described by reference to FIG. 9, one embodiment that includes resistor 902 and node 916, and one embodiment that does not include these elements. In both embodiments, the circuit 900 includes a similar thin oxide load circuit 118 and current source circuit 122 arranged and connected as described above by reference to FIG. 1, the description of which is not repeated here for brevity. The circuit 900 further includes a protection circuit 120 comprising a sensing portion and a protection portion. The protection circuit 120 includes a comparator (e.g., an operational amplifier) 918 as the sensing portion, wherein a first input of the comparator 918 is connected to node 114, and a second input of the comparator is connected to a reference voltage node 910 to receive a reference voltage, Vref.

In accordance with the first embodiment illustrated by reference to FIG. 9, the circuit 900 includes the resistor 906 connected between the supply node (in this case node 102) and a supply input node (in this case node 916). In this embodiment, the supply voltage VDD is connected to the node 916 instead of the node 102 (as in previous embodiments). The resistor 902 can be, for instance, a physical resistor, an NMOS transistor with a large magnitude gate to source voltage such that the transistor functions in the linear region of operator and acts like a resistor, or a PMOS transistor with a large negative gate to source voltage. Further to this first embodiment, the protection portion of the protection circuit (120) comprises a transistor (in this case 908) having a gate terminal connected to an output terminal of the comparator (918), a second (drain) terminal connected to the supply node (102) and a third (source) terminal connected to the second supply node (112). In this embodiment, transistor 908 is an NMOS transistor.

During operation, the comparator 918 compares the voltage VGND to the reference voltage Vref. When VGND is above the reference voltage, Vref, the NMOS transistor is turned off. However, when VGND falls below or is more negative than Vref, the comparator 918 is configured to supply an output voltage to the gate of NMOS transistor 908 to turn on that transistor. When the transistor 908 is turned on, it draws current from the power supply VDD in order to decrease the voltage at the node 102 to limit the voltage differential across the thin oxide load circuit 118 to no more than a predetermined maximum value. Additional decreases to VGND with respect to the reference voltage, Vref, causes the operational amplifier 918 to provide a more positive gate voltage to transistor 908, thereby, causing it to sink more current to the second power supply at node 112. More current through the resistor 902 results in a higher voltage drop across the resistor 902 and a resulting further decrease in the voltage at node 102. The value of resistor 902 can be varied to optimize operation of the circuit 900 and maintain a constant voltage across the thin oxide load circuit 118.

In accordance with the second embodiment illustrated by reference to FIG. 9, as stated above, resistor 906 is absent. Therefore, the supply voltage VDD is directly connected to the node 102 as in previous embodiments. In this embodiment, the sensing portion (i.e., the comparator 918) of the protection circuit 120 is the same. However, the protection portion is arranged differently. More particularly, the protection circuit comprises the transistor (908) having the gate terminal connected to the output terminal of the comparator (918), the second (drain) terminal connected to the supply node (102) and the third (source) terminal connected to the virtual ground node (114). During operation, When VGND is above the reference voltage, Vref, the NMOS transistor is turned off. However, when VGND falls below or is more negative than Vref, the comparator 918 is configured to supply an output voltage to the gate of NMOS transistor 908 to turn on that transistor. When the transistor 908 is turned on, it draws current from the power supply VDD in order to decrease the voltage at the node 102 to limit the voltage differential across the thin oxide load circuit 118 to no more than 1 V in one embodiment.

FIGS. 10 and 11 illustrate circuits 1000 and 1100, respectively, which each includes a protection circuit 120 that provides an alert signal to indicate a status of a thin oxide load circuit, in accordance with embodiments of the present teachings. In one example implementation (shown in FIG. 10), if the voltage across thin oxide transistors is too high as compared to the presented Vref, the gate voltage of the current source transistor (104) will drop to VSS and turn the transistor 104 off. An alert (a voltage high) signal will be sent out to indicate the status of the current source transistor 104, in this case a voltage high. Each circuit 1000 and 1100 includes a similar thin oxide load circuit 118 and current source circuit 122 arranged and connected as described above by reference to FIG. 1, the description of which is not repeated here for brevity. An exception of the circuit 1000 arrangement is the connection of the gate terminal of the transistor 104 within the current source circuit 122, as described below.

The protection circuit 120 of circuit 1000 includes a comparator (e.g., an operational amplifier) 1010 as the sensing portion, wherein a first input of the comparator 1010 is connected to node 114, and a second input of the comparator is connected to a reference voltage node 1012 to receive a reference voltage, Vref. The protection portion of the protection circuit (120) comprises a first inverter (1020) having an input terminal connected to the output terminal of the comparator (1010), at a node 1042, and an output terminal connected to the control signal node (108), and a second inverter (1030) having an input terminal connected to the output terminal of the first inverter (1020). The second inverter (1030) is operative to provide an alert signal at a node 1040.

Using the circuit 1000 arrangement, the protection circuit 120 controls the current source for the thin oxide load circuit 118 in order to limit the voltage differential across circuit 118. More particularly, during operation, the comparator 1010 compares the voltage VGND, at node 114, to the reference voltage, Vref. When VGND falls below Vref, the comparator 1010 provides an output signal high enough to trigger the inverter 1020, which generates a correspondingly low enough signal to decrease the current through the transistor 104 in order to raise VGND to limit the voltage differential across the thin oxide load circuit 118 to a predetermined maximum value. In some embodiments, the signal at the control signal node 108 shuts down the transistor 104.

The protection circuit 120 of circuit 1100 includes a comparator (e.g., an operational amplifier) 1130 as the sensing portion, wherein a first input of the comparator 1130 is connected to node 114, and a second input of the comparator is connected to a reference voltage node 1112 to receive a reference voltage, Vref. The protection portion of the protection circuit 120 comprises: a first inverter (1140) having an input terminal connected to the output terminal of the comparator (at a node 1162) and having an output terminal; a Complementary Metal-Oxide Semiconductor (CMOS) transmission gate (1108) connected between the virtual ground node (114) and a maximum voltage node (116) that is configured to receive a second maximum voltage value (Vmax); a second inverter (1150) having an input terminal connected to the output terminal of comparator (1130), wherein the second inverter (1150) is operative to provide an alert signal (at a node 1160).

The CMOS transmission gate (1108) comprises a first gate terminal connected to the output terminal of the comparator (1130) and a second gate terminal connected to the output terminal of the first inverter (1140). More particularly, the CMOS transmission gate 1108 includes two parallel connected NMOS (1110) and PMOS (1120) transistors, wherein the drain terminals of the transistors are connected together at the node 116 to receive Vmax, and the source terminals of the transistors are connected together at the virtual ground node 114. This arrangement creates a conduction path between nodes 116 and 114 when the transistors 1110 and 1120 are turned on. Specifically, when VGND falls below Vref, the comparator provides a positive (voltage) signal to the gate of the NMOS transistor to turn on this transistor and also provides the positive signal to the input of the inverters 1140 and 1150. The inverter 1140 generates a negative voltage on the gate of the PMOS transistor to turn on this transistor and to enable the transmission gate 1108 and pass Vmax to the node 114, to limit the voltage difference across the thin oxide load circuit 118 to VDD−Vmax. The inverter 1150 further generates the alert signal at the node 1160 in response to the positive voltage input from the comparator 1130.

Figure 12:
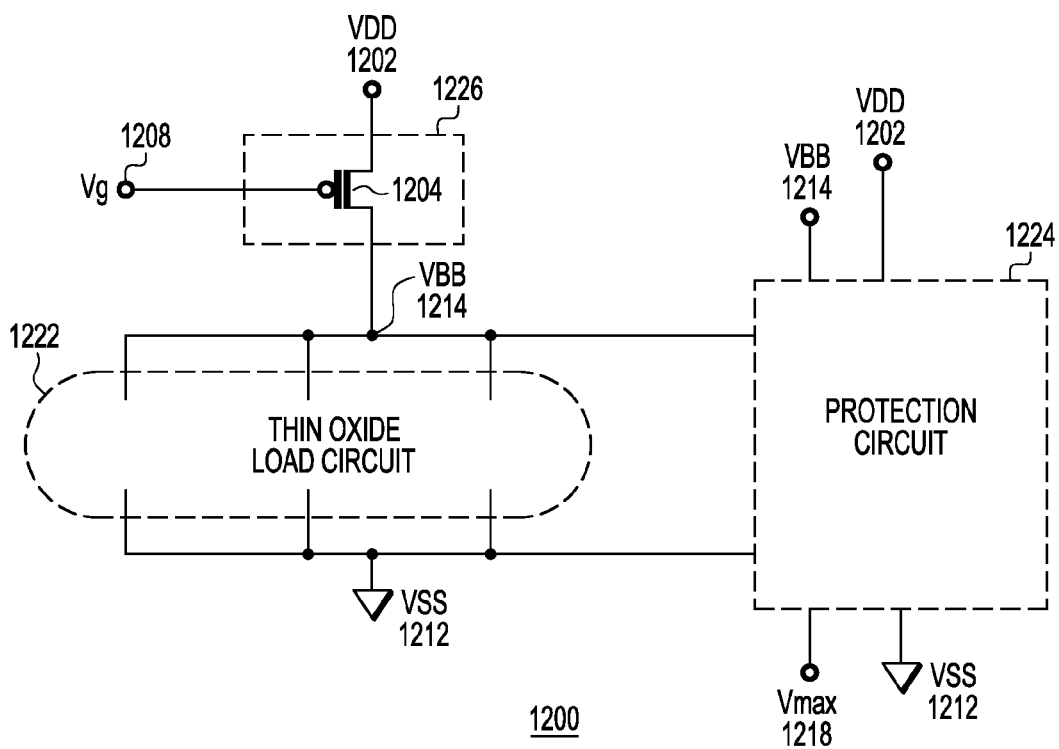
FIG. 12 illustrates the complementary implementation of the circuit shown in FIG. 1, in accordance with an embodiment.

FIG. 12 illustrates a complementary circuit 1200 to the circuit 100 shown in FIG. 1. In circuit 1200 a PMOS current source is located at the top of a thin oxide load circuit instead of an NMOS current sink located at the bottom of the thin oxide load circuit as shown in FIGS. 1-11. Circuit 1200 comprises a thin oxide load circuit 1222 disposed on a thin oxide portion of a substrate; a current source circuit 1226 disposed on a thick oxide portion of the substrate; and a protection circuit 1224 disposed on the thin oxide portion or the thick oxide portion of the substrate. The circuit 1200 further includes first and second power supply sources (not shown) disposed on substrate. The first power supply source provides a positive voltage VDD at a supply node 1202, and the second power supply source provides a more negative voltage VSS at a supply node 1212. In an embodiment, VSS is at a ground potential. However, VSS need only be at a more negative potential than VDD.

In this embodiment, the current source 1226 comprises a single PMOS transistor 1204 (used as a current source) having a gate terminal connected to a control signal node 1208, a drain terminal connected to a virtual supply node 1214 and a source terminal connected to the supply node 1202. The current source 1226 is operable to receive a control signal Vg (having a negative potential) coupled to the control signal node 1208 and to provide a virtual supply voltage (VBB) at the node 1214, which is based on the magnitude of the control signal, which in turn controls the magnitude of current through the PMOS transistor 1204. The control signal is set to a magnitude to (in most instances of IC operation) control the voltage differential between the supply node 1212 and the node 1214. In an embodiment, the control signal is set to a magnitude to control a voltage differential (VBB−VSS) to be less than 1 V, across the thin oxide load circuit 1222.

The thin oxide load circuit 1222 is connected between the virtual supply node 1214 and the supply node 1212. In an embodiment, circuit 1222 comprises a ring oscillator that includes a chain of an odd number of inverters, wherein each inverter has a first terminal connected to the supply node 1212 and a second terminal connected to the virtual supply node 1214. The ring oscillator can be single-ended or differential. The voltage protection circuit 1224 is used to limit or clamp the voltage difference between VBB and VSS at nodes 1214 and 1212, respectively, in order to provide over voltage protection for the thin oxide load circuit 1222. This voltage difference is clamped to a pre-determined value such as 1 V. The protection circuit 1224 can take any number of forms. For example, complementary representations of any of the circuits 400 through 1100 shown in FIGS. 4-11, respectively, are possible, wherein the protection circuit is connected to a set of the nodes 1202 (to receive VDD), 1212 (to receive VSS), 1214 (to receive VBB), or a node 1218 (to receive a Vmax voltage that is larger than VDD) depending on the particular protection circuit embodiment.

Figure 13:
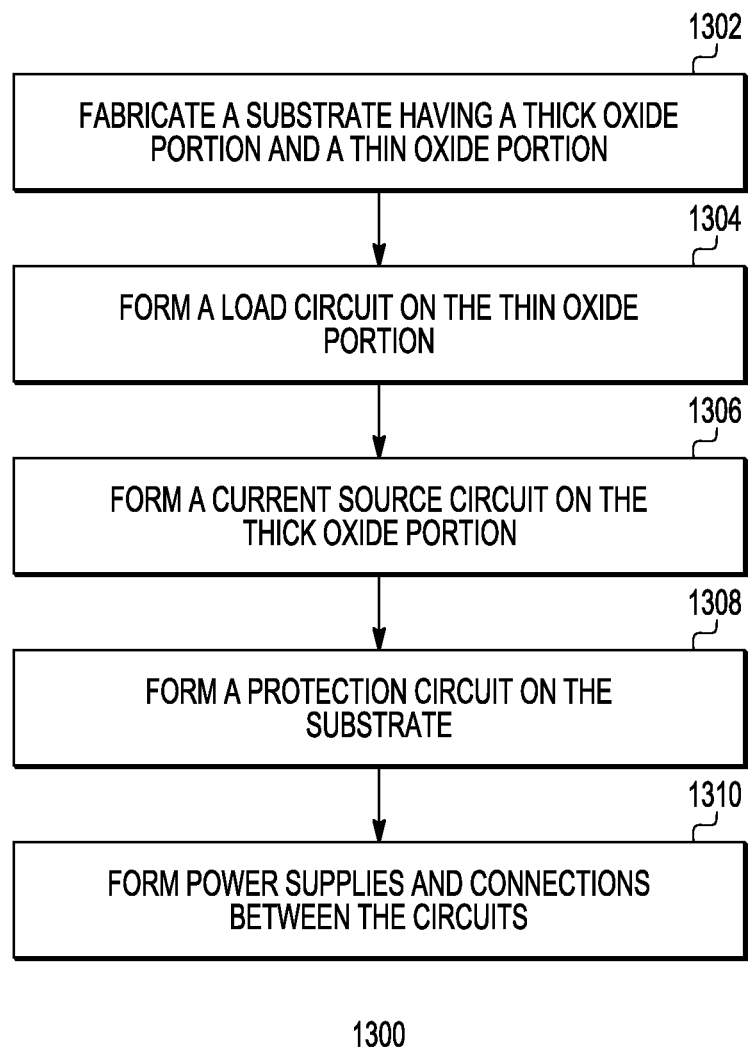
FIG. 13 illustrates a flow chart of a method of fabricating a CMOS integrated circuit comprising a current source circuit, a thin oxide load circuit, and a voltage protection circuit for the thin oxide load circuit, in accordance with an embodiment.

FIG. 13 illustrates a method 1300 of fabricating an integrated circuit having a protection circuit in accordance with the present teachings. In an embodiment, the integrated circuit is fabricated using a complementary-metal-oxide-semiconductor, CMOS, fabrication process 1300. Process 1300 can be used to fabricate any of the circuits described above by reference to FIGS. 1-12. Process 1300 begins with a silicon wafer that is fabricated, at 1302, to include a thin oxide portion and a thick oxide portion. The substrate thickness for both thin and thick oxide transistors are the same. The difference is in the oxide thickness. In an embodiment, the thin oxide may be 3 nm and the thick oxide transistor may have a gate oxide thickness of 5~6 nm.

The load circuit is formed (at 1304) on the thin oxide portion of the substrate, and the current source circuit is formed (at 1306) on the thick oxide portion of the substrate. The thin oxide load circuit contains one or more "fragile" or thin gate oxide devices in that the gate oxides (fabricated in the thin oxide portion of the substrate) of these devices easily breakdown with over voltages or transient high voltages, which short the devices causing them to fail during circuit start-up or operation. The thin gate oxide devices, however, have increased performance characteristics. The thicker or "thick" gate oxide devices are more robust, can withstand higher gate voltages, but have lower performance.

The protection circuit is formed (at 1308) on either the thin oxide or the thick oxide portion of the substrate. The protection circuit includes a sensing portion and a protection portion. The sensing portion is coupled to the virtual supply node and is operable to detect the voltage at this node. The protection portion is coupled to the sensing portion and is operable, in response to feedback from the sensing portion of the sensed voltage, to prevent a difference in voltage between the virtual ground or virtual supply voltage and a second voltage at the supply node from exceeding a first maximum voltage value.

In an embodiment, forming the current source circuit on the substrate comprises forming on the thick oxide portion of the substrate an N-channel Metal Oxide Semiconductor transistor or a P-channel Metal Oxide Semiconductor transistor having a gate terminal connected to the control signal node, a second terminal connected to the virtual supply node and a third terminal connected to a second supply node; and forming the protection circuit on the substrate comprises forming the protection circuit on the thick oxide portion of the substrate. In a further embodiment, forming the load circuit on the thin oxide portion of the substrate comprises forming a ring oscillator that includes a chain of an odd number of inverters, wherein each inverter has a first terminal connected to the supply node and a second terminal connected to the virtual supply node.

The process 1300 further includes, at 1310, forming or adding power supply circuits to the IC (e.g., that generate supply voltages such as VDD, VSS, etc.), interconnecting the circuits formed at 1304-1308, connecting the circuits to the supply voltages, and connecting the circuits to input and output circuit ports or pads. The order of performing process functions 1302-1310 and the order or the functions within block 1310 can be varied from what is shown in FIG. 13. For example, metals used to interconnect the thin oxide load circuit, the current source circuit, and the protection circuit to one another and to the power supplies on the IC can be fabricated on the IC either before or after fabricating the circuits themselves on the IC.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

For the sake of brevity, conventional techniques related to semiconductor fabrication (including those using conventional CMOS technology), CMOS devices, MOSFETs, voltage protection circuits, thin oxide voltage controlled ring oscillator circuits, analog circuits, digital control and logic circuits, and other functional aspects of a system, and the individual system operating components are not be described in detail. Furthermore, the connecting lines shown in the various figures contained herein are intended to represent example functional relationships and/or physical couplings between the various elements.

It should be noted that many alternative or additional functional relationships or physical connections may be present in a practical embodiment. In addition, for ease of discussion, the figures illustrate example, single-ended implementations, but those skilled in the art can adapt illustrated techniques for use in differential circuit applications using the provided guidelines without departing from the scope of the present disclosure. Moreover, the various IC embodiments described above (e.g., with respect to FIGS. 1-13) may be produced or fabricated using conventional semiconductor processing techniques, in particular, well-known CMOS techniques. Further a variety of well-known and common semiconductor materials may be used, e.g., traditional metals (aluminum, copper, gold, etc.), polysilicon, silicon dioxide, silicon nitride, silicon, and the like.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%.

As used herein, the term "configured to", "configured with", "arranged to", "arranged with", "capable of" and any like or similar terms means that referenced circuit elements have an internal physical arrangement (such as by virtue of a particular transistor technology used) and/or physical coupling and/or connectivity with other circuit elements in an inactive state. This physical arrangement and/or physical coupling and/or connectivity (while in the inactive state) enables the circuit elements to perform stated functionality while in the active state of receiving and processing various signals at inputs of the circuit elements to generate signals at the output of the circuit elements.

As further used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The above description refers to nodes or features being "connected" or "coupled" together. As used here and, unless expressly stated otherwise, "coupled" means that one node or feature is directly or indirectly joined to (or is in direct or indirect communication with) another node or feature, and not necessarily physically. As used herein, unless expressly stated otherwise, "connected" means that one node or feature is directly joined to (or is in direct communication with) another node or feature. For example, a switch may be "coupled" to a plurality of nodes, but all of those nodes need not always be "connected" to each other; moreover, the switch may connect different nodes to each other depending on the state of the switch. Furthermore, although the various circuit schematics shown herein depict certain example arrangement of elements, additional intervening elements, devices, features, or components may be present in an actual embodiment (assuming that the functionality of the given circuit is not adversely affected).

The Abstract of the Disclosure is provided to allow the reader to quickly ascertain the nature of the technical disclosure. It is submitted with the understanding that it will not be used to interpret or limit the scope or meaning of the claims.

In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An integrated circuit that provides over voltage protection for a thin oxide load circuit, the integrated circuit comprising:
    a substrate having a thick oxide portion and a thin oxide portion;
    a load circuit disposed on the thin oxide portion, wherein the load circuit has a first end that is coupled to a first supply node and a second end that is directly connected to a virtual supply node;
    a current source circuit disposed on the substrate, the current source circuit having an input coupled to a control signal node and an output directly connected to the virtual supply node, wherein the current source circuit is operable to provide a voltage at the virtual supply node, which is based on a control signal coupled to the control signal node;
    a protection circuit disposed on the substrate and disconnected from the control signal node of the current source circuit, the protection circuit comprising a sensing portion coupled to a protection portion, wherein the sensing portion is directly connected to the virtual supply node and is operable to sense the voltage at the virtual supply node and, when the sensed voltage meets an intrinsic or extrinsic reference voltage value, to activate the protection portion, which is external to the current source circuit, wherein the protection circuit is coupled to the sensing portion and is operable in response to feedback from the sensing portion of the sensed voltage, to clamp a difference in voltage between the voltage at the virtual supply node and a second voltage at the first supply node to a first maximum voltage value that is established by the second voltage at the first supply node and the control signal, the magnitude of which is set by a source external to the protection circuit.

2. The integrated circuit of claim 1, wherein the load circuit comprises a ring oscillator that includes a chain of an odd number of inverters, wherein each inverter has a first terminal connected to the first supply node and a second terminal connected to the virtual supply node.

3. The integrated circuit of claim 2, wherein the ring oscillator comprises a single-ended oscillator or a differential oscillator.

4. The integrated circuit of claim 2, wherein the ring oscillator comprises three inverters.

5. The integrated circuit of claim 1, wherein the protection circuit is disposed on the thin oxide portion or the thick oxide portion of the substrate.

6. The integrated circuit of claim 1, wherein the protection circuit comprises a diode having a first terminal coupled to the virtual supply node and a second terminal coupled to the first supply node or to a maximum voltage node that is configured to receive a second maximum voltage value.

7. The integrated circuit of claim 1, wherein the protection circuit comprises a diode-connected transistor comprising a first terminal connected to the virtual supply node and a second and third terminal coupled to the first supply node or to a maximum voltage node that is configured to receive a second maximum voltage value.

8. The integrated circuit of claim 7, wherein the diode-connected transistor comprises an N-channel Metal Oxide Semiconductor transistor or a P-channel Metal Oxide Semiconductor transistor.

9. The integrated circuit of claim 7, wherein the second terminal comprises a gate terminal, and the second and third terminal are connected together and connected to the first supply node or to the maximum voltage node.

10. The integrated circuit of claim 7, wherein the second terminal comprises a gate terminal, and wherein the integrated circuit further comprises a Complementary Metal-Oxide Semiconductor (CMOS) transmission gate connected between the gate terminal and the first supply node or the maximum voltage node to control conductivity of the diode-connected transistor using first and second enabling voltages.

11. The integrated circuit of claim 1, wherein the sensing portion of the protection circuit comprises a comparator having a first input terminal connected to the virtual supply node, a second input terminal connected to a voltage reference node that is configured to receive a reference voltage, and an output terminal, wherein the comparator is configured for operating in two states to switch an operation of a device having an input connected to the output terminal.

12. The integrated circuit of claim 11, wherein the protection portion of the protection circuit comprises a transistor having a gate terminal connected to the output terminal of the comparator, a second terminal connected to the first supply node and a third terminal connected to the virtual supply node.

13. The integrated circuit of claim 11 further comprising a resistor connected between the supply node and a supply input node, wherein the protection portion of the protection circuit comprises a transistor having a gate terminal connected to the output terminal of the comparator, a second terminal connected to the first supply node and a third terminal connected to a second supply node.

14. The integrated circuit of claim 11, wherein the protection portion of the protection circuit comprises a first inverter having an input terminal connected to the output terminal of the comparator and an output terminal connected to the control signal node and a second inverter having an input terminal connected to the output terminal of the first inverter, wherein the second inverter is operative to provide an alert signal.

15. The integrated circuit of claim 11, wherein the protection portion of the protection circuit comprises:
    a first inverter having an input terminal connected to the output terminal of the comparator and an output terminal;
    a Complementary Metal-Oxide Semiconductor (CMOS) transmission gate connected between the virtual supply node and a maximum voltage node that is configured to receive a second maximum voltage value, the CMOS transmission gate comprising a first gate terminal connected to the output terminal of the comparator and a second gate terminal connected to the output terminal of the first inverter; and
    a second inverter having an input terminal connected to the output terminal of comparator, wherein the second inverter is operative to provide an alert signal.

16. The integrated circuit of claim 1, wherein the current source circuit comprises an N-channel Metal Oxide Semiconductor transistor or a P-channel Metal Oxide Semiconductor transistor having a gate terminal connected to the control signal node, a second terminal connected to the virtual supply node and a third terminal connected to a second supply node.

17. A method of fabricating an integrated circuit on a substrate having a thick oxide portion and a thin oxide portion, the method comprising:
forming a load circuit on the thin oxide portion of the substrate, wherein the load circuit has a first end that is coupled to a first supply node and a second end that is directly connected to a virtual supply node;
forming a current source circuit on the current source circuit having an input coupled to a control signal node and an output directly connected to the virtual supply node, wherein the current source circuit is operable to provide a voltage at the virtual supply node, which is based on a control signal coupled to the control signal node;
forming a protection circuit on the substrate wherein the protection circuit is disconnected from the control signal node of the current source circuit, the protection circuit comprising a sensing portion coupled to a protection portion, wherein the sensing portion is directly connected to the virtual supply node and is operable to sense the voltage at the virtual supply node and, when the sensed voltage meets an intrinsic or extrinsic reference voltage value, to activate the protection portion, which is external to the current source circuit, wherein the protection circuit is coupled to the sensing portion and is operable, in response to feedback from the sensing portion of the sensed voltage, to clamp a difference in voltage between the voltage at the virtual supply node and a second voltage at the first supply node to a first maximum voltage value that is established by the second voltage at the first supply node and the control signal, the magnitude of which is set by a source external to the protection circuit.

18. The method of claim 17, wherein the integrated circuit is fabricated using a Complementary Metal-Oxide Semiconductor process.

19. The method of claim 18, wherein:
forming the current source circuit on the substrate comprises forming on the thick oxide portion of the substrate an N-channel Metal Oxide Semiconductor transistor or a P-channel Metal Oxide Semiconductor transistor having a gate terminal connected to the control signal node, a second terminal connected to the virtual supply node and a third terminal connected to a second supply node;
forming the protection circuit on the substrate comprises forming the protection circuit on the thick oxide portion of the substrate.

20. The method of claim 17, wherein forming the load circuit on the thin oxide portion of the substrate comprises forming a ring oscillator that includes a chain of an odd number of inverters, wherein each inverter has a first terminal connected to the first supply node and a second terminal connected to the virtual supply node.

* * * * *